(12) United States Patent
Boucher

(10) Patent No.: US 6,630,845 B2
(45) Date of Patent: Oct. 7, 2003

(54) SEMICONDUCTOR INTEGRATED CIRCUIT AND COMMUNICATION DEVICE FOR LOGIC INPUT-STATE CONTROL DURING AND FOLLOWING POWER-UP

(75) Inventor: Richard E. Boucher, Santa Clara, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/833,705

(22) Filed: Apr. 13, 2001

(65) Prior Publication Data

US 2003/0107416 A1 Jun. 12, 2003

(51) Int. Cl.[7] .................. H03K 19/094; H03K 19/003; G06F 13/00
(52) U.S. Cl. ...................... 326/83; 326/33; 327/108; 710/302
(58) Field of Search ............... 326/83, 82, 86, 326/31, 33, 34; 327/108, 109, 111; 323/274; 710/302, 301

(56) References Cited

U.S. PATENT DOCUMENTS 5,220,211 A * 6/1993 Christopher et al. .......... 326/90
6,032,209 A * 2/2000 Mros et al. ................ 710/302
6,138,195 A * 10/2000 Bermingham et al. ....... 710/104
6,308,233 B1 * 10/2001 Park ........................... 710/302

* cited by examiner

Primary Examiner—Michael Tokar
Assistant Examiner—James Cho
(74) Attorney, Agent, or Firm—Perkins Coie LLP

(57) ABSTRACT

The present invention provides a semiconductor integrated circuit device and a communication device incorporating same. Two MOS (strong and weak) devices are connected to each control input of a transceiver. Both MOS devices are turned on while the supply voltage is ramping from 0V. The strong device remains on for a period of 10–20 microseconds. The strong MOS device pulls the input to a disabled state against external capacitance which is attempting to pull the input to an enabled state. The weak MOS device remains on while pulling the input to a disabled state. The input is pulled to an enabled state when an external source overcomes the weak MOS device. Once the control input is pulled beyond the input voltage threshold to the enabled state, the weak MOS device will be turned off permanently and the input will revert to a standard CMOS input with infinite input resistance.

37 Claims, 9 Drawing Sheets

SEMICONDUCTOR INTEGRATED CIRCUIT AND COMMUNICATION DEVICE FOR LOGIC INPUT-STATE CONTROL DURING AND FOLLOWING POWER-UP

CROSS-REFERENCE TO RELATED APPLICATIONS

Not applicable.

STATEMENT REGARDING FEDERALLY SPONSORED RESEARCH

Not applicable.

FIELD OF THE INVENTION

The present invention relates generally to semiconductor integrated circuit devices, and more particularly to a semiconductor integrated circuit device for input logic-state control following power-up.

BACKGROUND OF THE INVENTION

Recently, the data communications industry has embraced a new application known as "Hot Swap". As part of this application, a circuit board that has at least one data communications transceiver is plugged into or removed from a powered or hot back plane. The powered back plane is a large circuit board with multiple elongated, rectangular sockets. Each socket receives the edge of a smaller circuit board which is to be plugged into the back plane. When a smaller circuit board is plugged into the socket, the smaller circuit board is physically held perpendicular to the back plane by the socket. The socket provides the electrical connection between the circuit board and the back plane. Thus, all power supply and electrical signal connections are provided by the socket. The terms "powered" or "hot" back plane imply that the circuit boards are inserted and removed from the back plane while power supply lines are at their operating voltages and signal lines are active which means that they are switching between their normal signal levels. Thus, during system maintenance or reconfiguration, the system remains functional and only partially degraded.

The data communication transceiver has a logic interface and a data interface. The data interface is connected to a data cable for transmitting and receiving data to other transceivers on the same data cable. The logic interface which includes both data and control lines is typically connected to a data communication processor which manages the transfer of data. When a Hot Swap circuit board is plugged into the powered back plane, it is essential that no disturbance to the signal levels on the data cable occur that could be detected as a transition by a receiving device connected to a data cable.

In the transceiver, one or more of the control inputs can act independently or ensemble to enable or disable the transmitter. When the transmitter is disabled, its drivers remain in a high impedance state having minimal leakage currents, such as 1 micro-amp or less. When the drivers for the transmitter are in a high impedance state, the transmitter is unable to impart a signal on the data cable. On the other hand, when the transmitter is enabled, the transmitter has the ability to drive significant amounts of current as high as ten's to hundred's of milli-amps. In this enabled state, the transmitter is able to impart a large signal on the data cable.

When a circuit board is plugged into a powered back plane, a short period of time exists when the data communication processor goes through a power-up initializing sequence. During this time, the output drivers of the data communication processor—which are connected to the control lines of the transceiver—remain in a high impedance state, and therefore are unable to drive the control lines to a defined logic level. The high impedance state may last indefinitely without intervention. The result of this high impedance state is that the control inputs of the transceiver may drift to levels that would enable the transceiver, thus causing large transitions on the data cable. Another complication exists in the fact that there are usually leakage currents as large as +10 micro-amps when these drivers are in the high impedance state. These leakage currents can cause the control inputs to drift high or low, inadvertently enabling the transceiver.

Yet another complication exists relating to the parasitic capacitance that is always present on a circuit board. The typical magnitude of this capacitance can be 10 pF to 50 pF at any signal connection. This parasitic capacitance may provide capacitive coupling of the control lines to either ground or to the power supply voltage. When the power supply voltage is ramping from 0V, capacitive coupling may cause the control lines to be pulled to or held at levels that would enable the transceiver, thereby causing large transitions on the data cable.

There is a need for a circuit that controls the input logic-state of a transceiver such that the control lines of a transceiver are able to be maintained in the disabled state during and after power-up in order to eliminate disturbance to the data cable.

SUMMARY OF THE INVENTION

The present invention solves the needs addressed above. The present invention provides a circuit and method for holding the control inputs in the disabled state as the supply voltage ramps up from 0V, especially in a Hot Swap environment. In accordance with the present invention, the control inputs are held in a disabled state for an indefinite period of time. The enabling/disabling circuit is used to overcome external capacitance that may otherwise pull the control input to the enabled state, thereby causing large disturbances to the data cable which could be erroneously detected as data transitions. The enabling/disabling circuit is also able to overcome continuous leakage currents from external drivers, such as the output drivers of a communication processor that are connected to the control lines of a transceiver. Such drivers may leak current while in their high impedance states. After the first time the external driver actively drives the control input to the enabled state, the internal holding current is turned off and the control input reverts to standard CMOS input that has essentially infinite input impedance.

Two MOS (metal oxide semiconductor) devices, one strong while the other is weak, are connected to each control input of a transceiver. A strong MOS device may be one which will generally maintain the logic state while sinking or sourcing one milli-amp of current, while a weak MOS device may be one which will generally allow the logic state to change when the sink/source current exceeds 50 micro-amps.

The strong MOS device is capable of pulling the input to a disabled state against external capacitance of as much as 100 pF. The weak MOS device requires a moderate input current, such as 100 micro-amps. In the present invention, the input voltage threshold at the input of the integrated circuit which is required to enable the transmitter is shifted by having the input source or sink current across an input resistor. The present invention includes an embodiment for both P-channel devices and N-channel devices. Both MOS devices are turned on while the supply voltage is ramping from zero volts (0V). The strong device remains on for a period of 10–20 microseconds. The strong MOS device pulls the input to a disabled state against external capacitance which can be as much as 100 pF. It is assumed that in the worst case situation the external capacitance is attempting to pull the input to an enabled state. After a timeout following power-up, the strong MOS device is turned off and the weak MOS device remains on while pulling the input to a disabled state. The input is pulled to an enabled state when an external source overcomes the weak MOS device. The weak MOS device requires a moderate input current, such as 100 micro-amps, but once the input is pulled beyond the input voltage threshold to the enabled state, the weak MOS device will be turned off permanently and the input will revert to a standard CMOS input with infinite input resistance.

BRIEF DESCRIPTION OF THE DRAWINGS

These and other objects, features, and characteristics of the present invention will become apparent to one skilled in the art from a close study of the following detailed description in conjunction with the accompanying drawings and appended claims, all of which form a part of this application. In the drawings:

DETAILED DESCRIPTION OF THE PRESENTLY PREFERRED EXEMPLARY EMBODIMENTS

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds, are therefore intended to be embraced by the appended claims.

The circuit elements described for this invention are generally available for semiconductor processes, and thus would generally require no special processing.

I. General Circuit

Prior to power-up, all inputs and internal node voltages to the semiconductor integrated circuit device of the present invention are at 0V. During power-up, the supply voltage is assumed to ramp from 0V to a final value (e.g., 3.3V or 5.0V). The ramping is assumed to occur over a period of time which could be ten's of nano-seconds to hundred's of milli-seconds. Initially, all signals float as the supply voltage ramps up to a single MOS device threshold.

Figure 1:
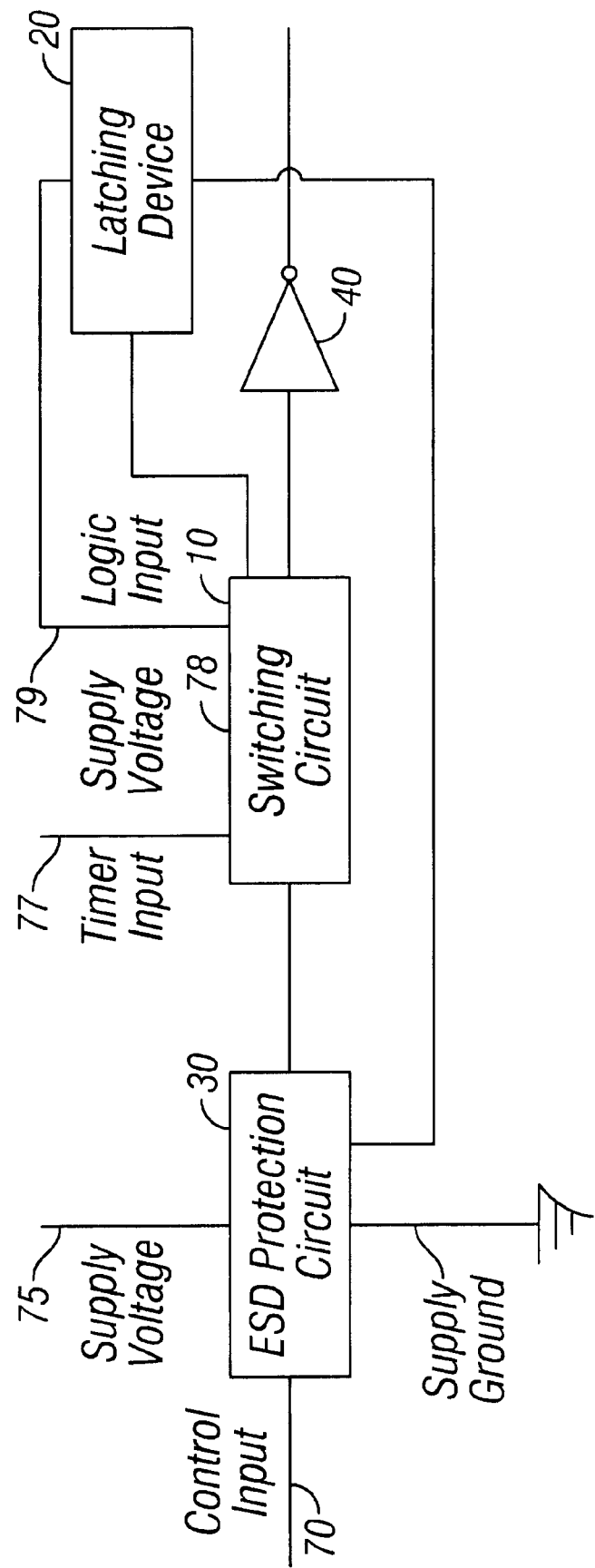
FIG. 1 is a block diagram of a circuit in accordance with one embodiment of the present invention.

Referring now to FIG. 1, illustrated is a generic block diagram representation of the semiconductor integrated circuit for input logic-state control. The major elements of the enabling/disabling circuit are the switching circuit 10, the latching device 20, the electrostatic discharge (ESD) protection circuit 30 and an inverter 40. A control input signal 70 is input into the ESD protection circuit 30. A supply voltage signal 75 and a supply ground signal 65 (ground) are also input into the ESD protection circuit. A timer signal 77 and logic input signal 79 are input into the switching circuit. A supply voltage signal 78 and a supply ground signal 76 (ground) are also input into the switching circuit. The operation of the circuit is described in more detail herein-below.

II. Circuit-Enabled Low

Figure 2A:
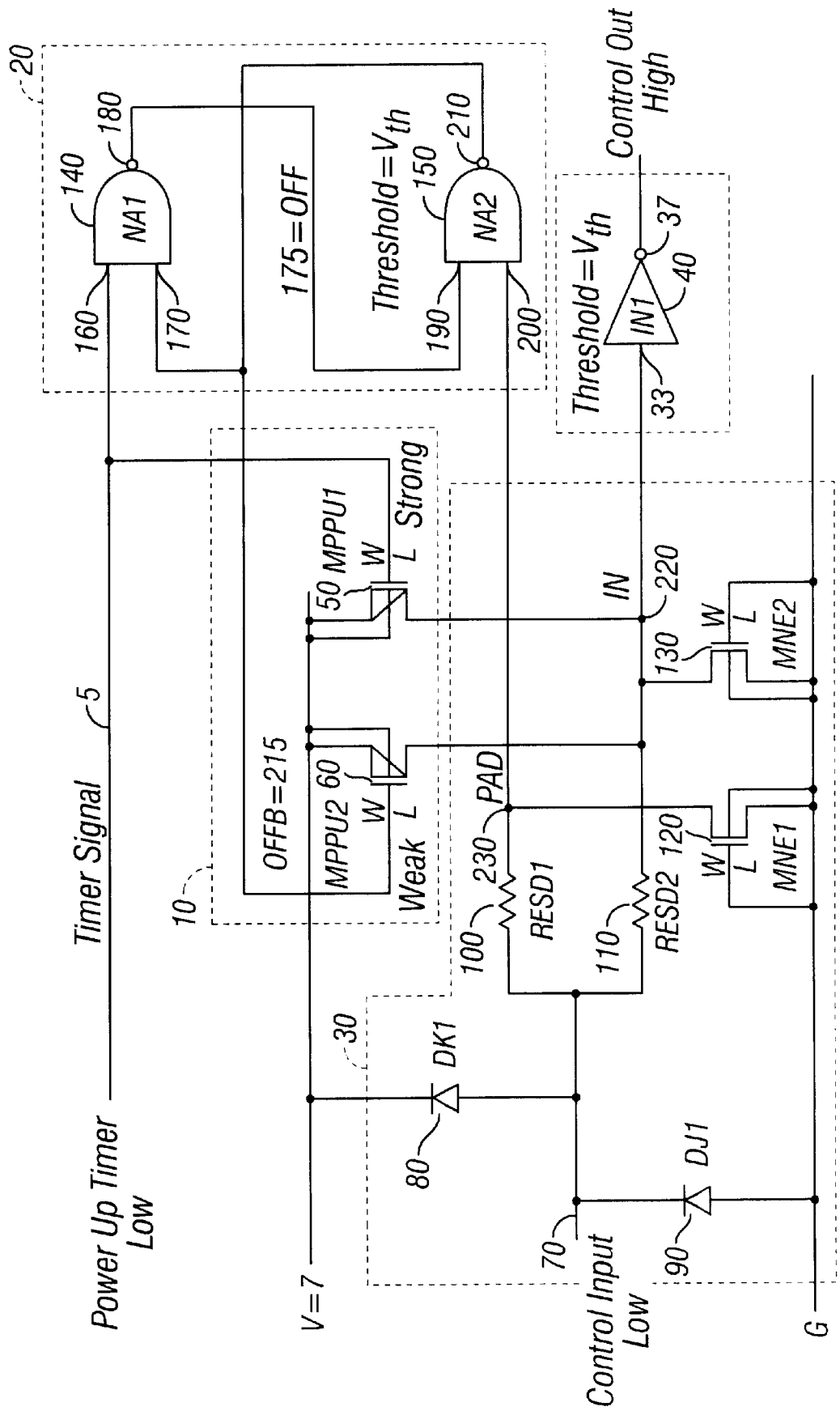
FIG. 2A is an illustration of a semiconductor integrated circuit device where the input is enabled low in accordance with one embodiment of the present invention with ESD protection.

Referring now to FIG. 2A, illustrated is a circuit diagram representation of the integrated circuit for input logic-state control following power-up wherein the input is enabled low. Therefore, if the input control input signal 70 which is low in this case is near ground (0V) the transmitter will be enabled. The circuit is composed of four major elements: a switching circuit 10, a latching device 20, ESD protection circuit 30 and an inverter 40. These elements can be seen superimposed over the individual elements.

The switching circuit is composed of a strong P-channel MOS device 50 and a weak P-channel MOS device 60. These devices include a gate, source and a drain. The gate of the strong P-channel MOS device is controlled by the timer signal. The gate of the weak P-channel MOS device is controlled by the latching circuit. When the timer signal is low the strong device is on; when the input from the latching circuit is low the weak device is on. The control signal 70 is the input pin to the data communication transceiver which is attached to an output driver of a communication processor.

The output driver of the communication processor is a large P-channel MOS device and a large N-channel MOS device. The source and body of the P-channel MOS device are tied to its supply (V-processor), it has an independent gate input, and the drain of the P-channel MOS device is connected to the drain of the complementary N-channel MOS device and to the output pad. The source and body of the N-channel MOS device are tied to its ground (G-processor), it has an independent gate input and the drain of the N-channel MOS device is connected to the drain of the complementary P-channel MOS device and to the output pad. When the gate input of the P-channel MOS is high (near its supply) the device is off. Conversely, when the gate of the N-channel MOS is low (near its ground) the device is off. In this condition the output is said to be OFF or High Impedance, neither driving high nor low. Even though these devices are off they can 'leak' current. A typical leakage specification which should be considered is 10 μA, and it can leak from the supply (V-processor) to the external circuit, or from the external circuit to the ground (G-processor). This leakage current is the reason for the "Weak" device in the circuits of the invention.

Latch 20 is composed of two NAND gates 140, 150 that are coupled to form a set-reset latch. Latch 20 is initialized by the timer signal 5 low, whereby the strong P-channel MOS device is on which pulls the node IN 220 up to the rising level of V which in turn pulls the node PAD 230 up through the resistors 110 and 100, and the output of the NAND gate 140 is high. With the two inputs to the NAND gate 150 high the output is low, initializing the latch 20.

Latch 20 is configured such that when a timer signal 5, which is initially low, times out and switches high, the outputs of neither the NAND gate 140 nor the NAND gate 150 change. NAND gate 140 has two input terminals 160, 170 and output terminal 180. The output of NAND gate 140 is the node designated as OFF 175. Similar to NAND gate 140, NAND gate 150 also has two input terminals 190, 200 and output terminal 210. The output of NAND gate 150 is node OFFB 215. Inverter 40 has an input terminal 33 and an output terminal 37.

The ESD protection circuit 30 is an optional addition to the novel circuit for input logic-state control. The ESD protection circuit is composed of two diodes 80, 90, two resistors 100, 110 and N-channel MOS devices 120, 130. N-channel MOS device 120 protects the gate input 200 of NAND gate 150, while MOS device 130 protects the gate input 33 of inverter 40. These devices operate in conjunction with the protection diode and their respective resistors 100, 110 to provide this gate protection. The diodes are essentially one-way valves that allow the current to flow toward other portions of the ESD protection circuit, namely ground or V. It should be appreciated by those of skill in the art that the ESD protection circuit could be composed of other elements. Resistor 110 serves a dual purpose as a part of the ESD protection, and also is required in the input path of the invention such that the circuit functions to maintain input thresholds. Resistors 100, 110 are representative of protection devices at the input of an integrated circuit. The resistors 100, 110 typically have a resistance in the neighborhood of 5 kilo-ohms.

ESD is easily conducted through the input/output and the power lead connections into the internal devices of integrated circuits and causes problems like gate oxide rupture and contact spiking. It is a common problem for integrated circuits to provide ESD protection in the form of input clamping and gate oxide protection. A high level of ESD with several hundred volts to a few thousand volts, which is easily transferred to the pins of an IC package during X handling, can bring permanent destruction to the internal devices of the IC. The present invention includes optional protection against such degenerative effects.

Figure 2B:
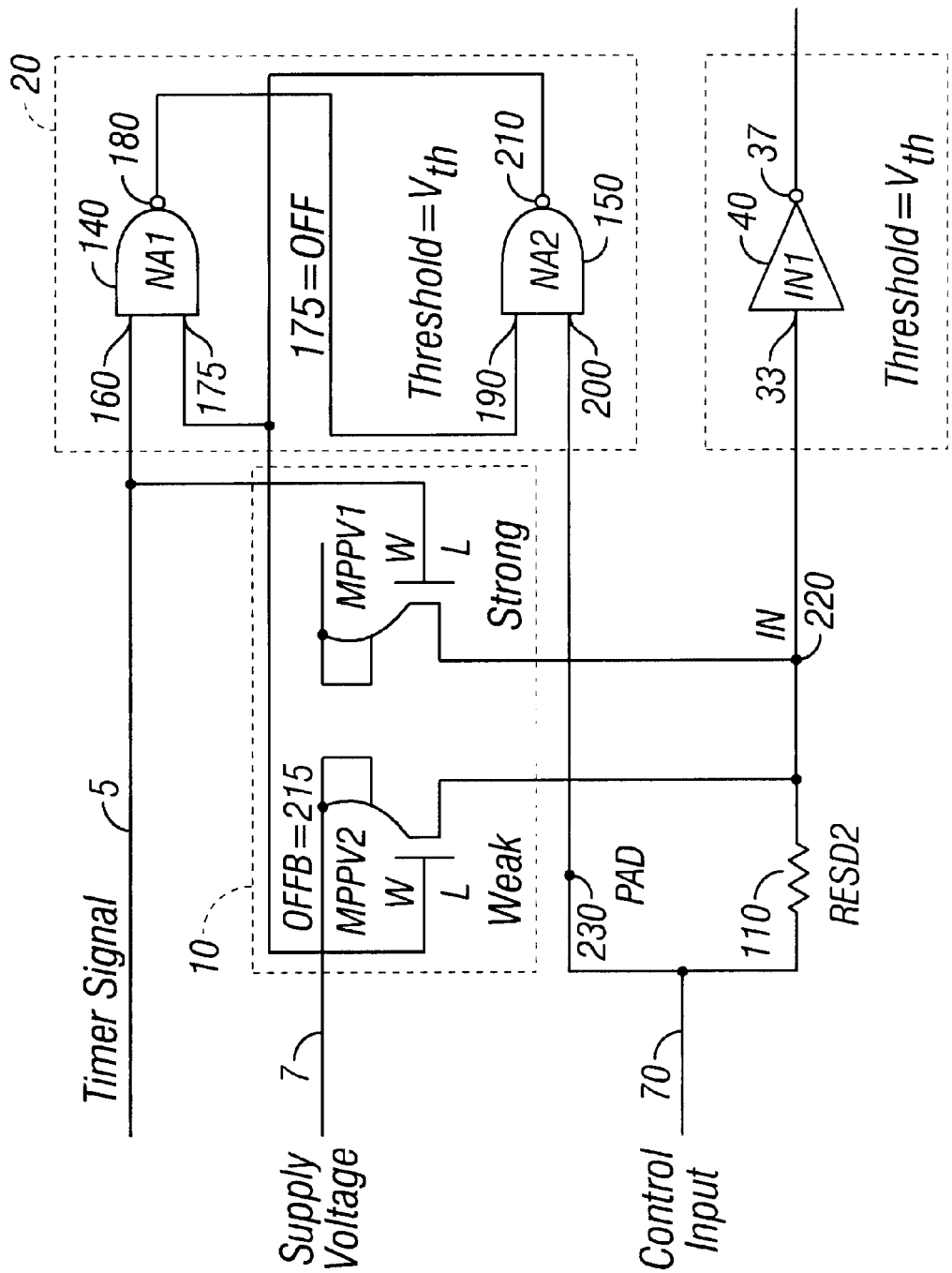
FIG. 2B is an illustration of a semiconductor integrated circuit where the input is enabled low in accordance with one embodiment of the present invention without ESD protection.
Figure 3:
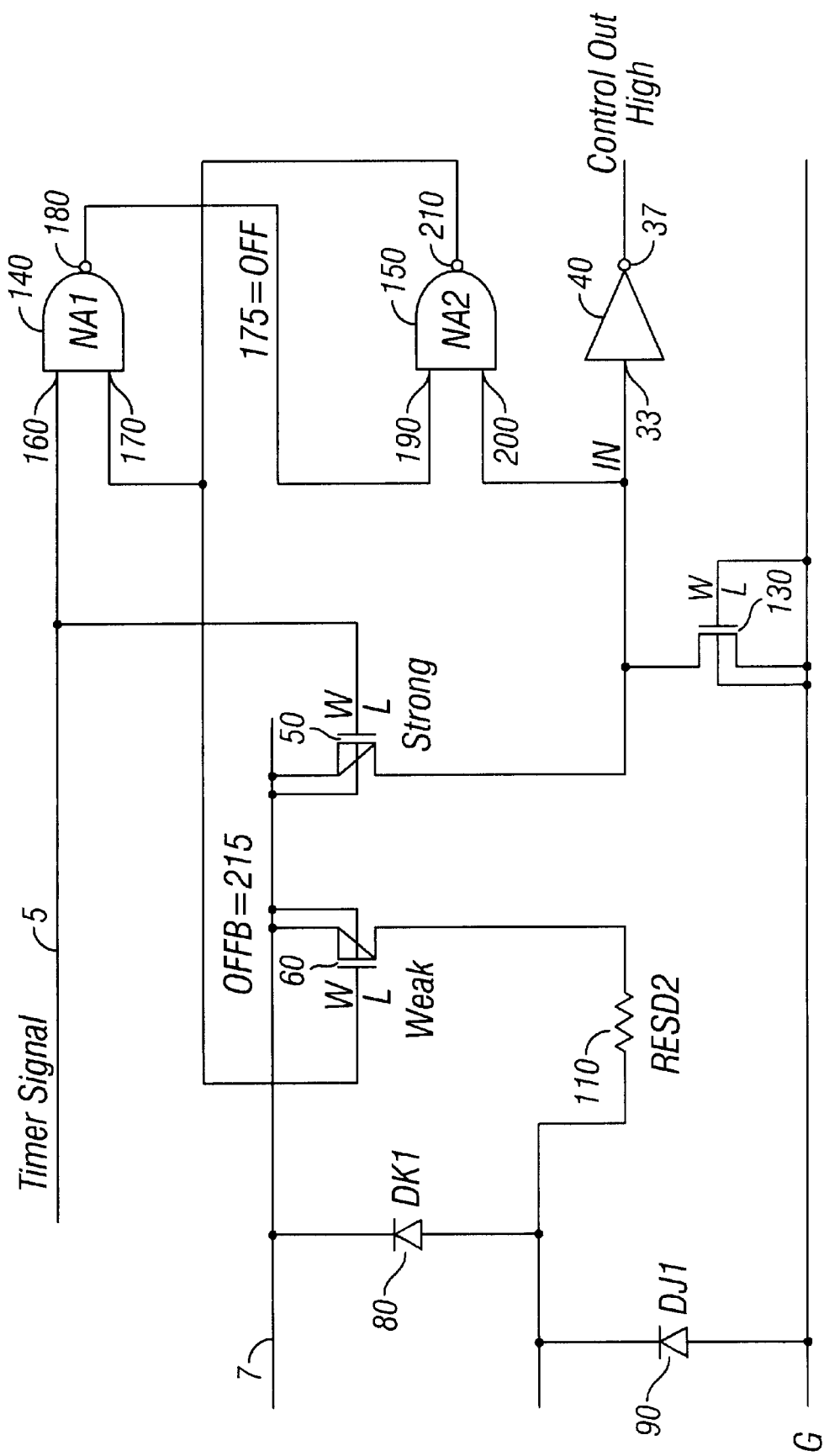
FIG. 3 is an illustration of an alternate embodiment of the semiconductor integrated circuit device where the input is enabled low in accordance with another embodiment of the present invention with ESD protection.
Figure 4:
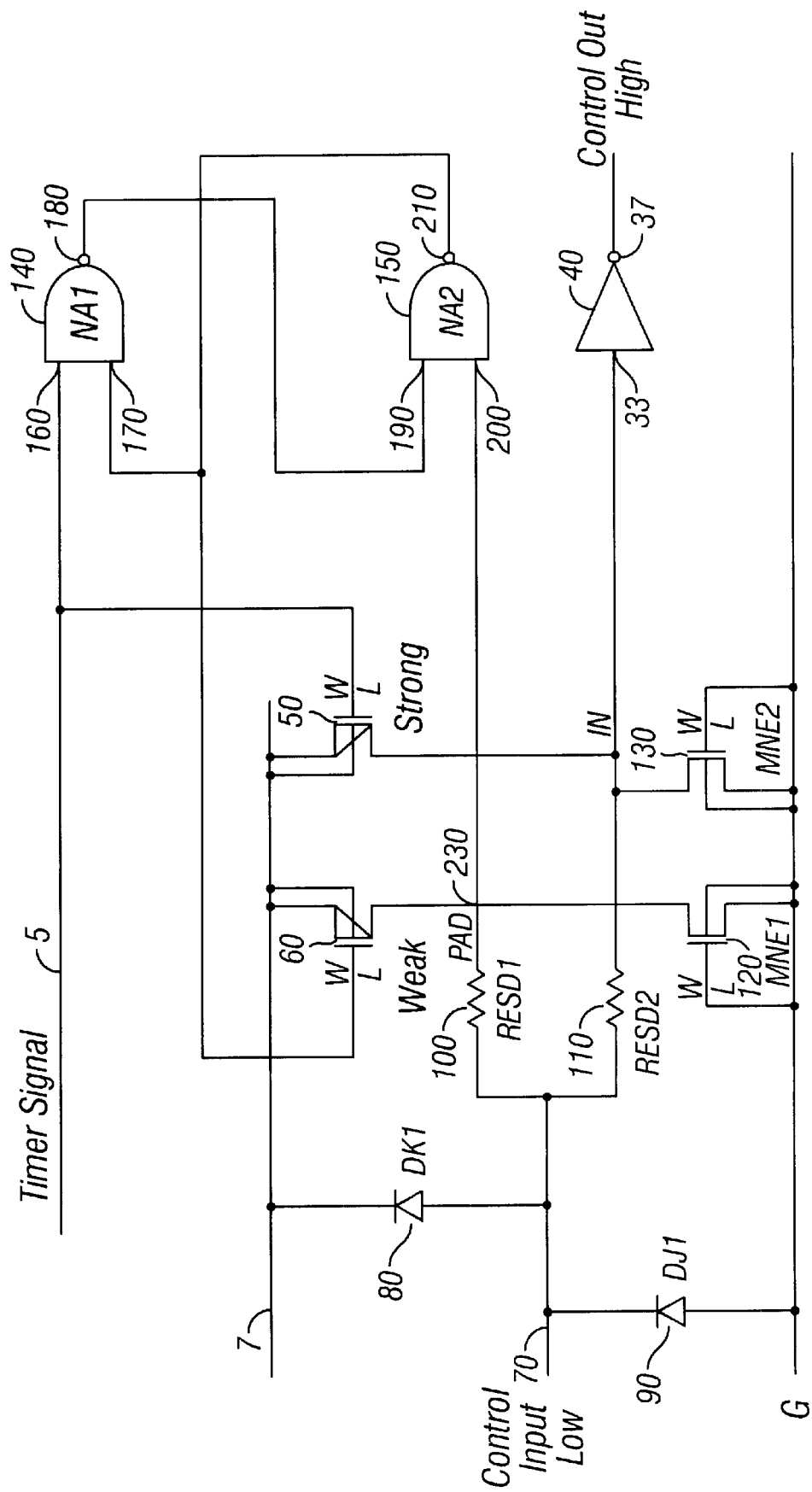
FIG. 4 is an illustration of yet another alternate embodiment of the semiconductor integrated circuit device where the input is enabled low in accordance with another embodiment of the present invention with ESD protection.

The semiconductor integrated circuit for input logic-state control can take other forms, and each can exist both with and without ESD protection. Referring now to FIG. 2B, illustrated is an embodiment of the circuit of FIG. 2A without ESD protection. Accordingly, the protection diodes 80 and 90 of FIG. 2A are removed, as are the NMOS protection devices 120 and 130 and the input resistor 100. Referring now to FIG. 3, illustrated is a circuit performing a similar function where the input signal path has been reconfigured and the ESD protection has been retained. Accordingly, the resistor 100 and MOS device 120 of FIG. 2A have been removed and the input of NAND gate 150 has been tied to the input of inverter 40. Referring now to FIG. 4, illustrated is yet another circuit performing a similar function where the input signal path has been reconfigured and the ESD protection has been retained. Accordingly, the MOS device 60 is connected to the node PAD 230, the input of NAND gate 150. For the purpose of consistency of the input voltage threshold and the quality of the input performance relative to a performance specification, the circuit configuration of FIG. 2A is preferred. ESD protection is present by virtue of the presence of the diodes 80 and 90, and the MOS device 130. ESD protection can be removed with the removal of these devices generally without otherwise effecting the function of the circuit.

The general operation of the circuit in FIG. 2A is now described. After the ramping supply voltage 7 reaches and exceeds a single MOS device threshold value (which generally varies from 0.3V to 0.8V), the timer signal 5 represented by "Power Up Timer Low" in this diagram goes low and is held at 0V. At this point, the strong MOS device 50 is turned on and pulls nodes IN 220 to the ramping supply voltage and, if no external voltage or external current source is driving the control signal 70, PAD 230 also goes to the value of the ramping supply voltage. With timer signal 5 low, the output of NAND gate 140 at node OFF 175 ramps with the supply, and as long as signal PAD 230 is high the output of NAND gate 150, OFFB 215, remains low which turns on the weak MOS device 60. The strong MOS device 50 by its nature is capable of supplying significant current to the input pin to charge up external parasitic capacitance and pull the control input signal 70 to V as the voltage ramps to the final supply voltage. As V continues to ramp, the circuit maintains this state and the internal node represented by "Control Out High" stays low which is the disabled state. The signal 5 represented by "Power Up Timer Low" stays low until an internal timer times out. This timer is of a duration of 10 microseconds to 20 microseconds, and the timer starts after the supply voltage ramps past about half the final power supply voltage. The timer duration may be substantially longer or shorter depending on the particular application requirements. When the timer eventually does time out the signal 5 represented by "Power Up Timer Low" goes high and the strong MOS device 50 is turned off and only the weak MOS device 60 remains on. Also, because the NAND gates 140, 150 form a common set-reset latch 20, when the timer times out and the timer signal 5 represented by "Power Up Timer Low" that is input to NAND gate 140 goes high the output of NAND gate 150 does not change. When the control input signal 70 "Control Input Low" is pulled below the input voltage threshold of NAND gate 150, the output of NAND gate 150 at node OFFB 215 is switched from low to high and the weak MOS device is turned off. In addition, because both inputs to NAND gate 140 are now high the output of NAND gate 140 goes low and the latch 20 has changed state and will retain this state independent of changes in the state of control signal 70. With both the strong MOS device 50 and the weak MOS device 60 turned off at this time, the input impedance at the control input reverts to that of a standard CMOS input.

The input voltage threshold (threshold) of any of the logic gates described herein including NAND gate 150, whether NAND, NOR, INV or otherwise, is determined by a combination of the P-channel MOS threshold, the N-channel MOS threshold (which are determined by the semiconductor process) and the relative strength (W/L) of the PMOS and NMOS devices forming the logic gate (which is determined by the design).

The threshold at the node where control input signal 70 enters the circuit at the time when the signal "Power Up Timer Low" is low is more complicated and relates to the voltage drop across the resistor 110. When current flows across a resistor there is a voltage drop in the direction of positive current flow. When only P-channel MOS device 60 is on, or when both P-channel MOS device 50 and P-channel MOS device 60 are on and a voltage source external to the device is driving the control input signal 70 (represented by "Control Input Low") below the supply voltage and toward the input threshold voltage, there will be a voltage drop across the resistor 110 which will lower the input threshold at node 70 relative to the threshold of the inverter 40. When the timer signal 5 (represented by "Power Up Timer Low") is low, both P-channel MOS device 50 and IP-channel MOS device 60 are on. At this point, the voltage drop across resistor 110 is so large that the threshold of inverter 40 cannot be reached even with node 70 at ground, and inverter 40 is prevented from switching. Also, when the timer signal 5 (represented by "Power Up Timer Low") is low the latch 20 is held in the set mode keeping P-channel MOS device 60 on. When the timer signal 5 (represented by "Power Up Timer Low") is high P-channel MOS device 50 is off, P-channel MOS device 60 is still on and the latch 20 can be reset by the first transition at the input node for control input signal 70 which goes below the input threshold of NAND gate 150. With only weak P-channel MOS device 60 on, there is a voltage drop across resistor 110, but the voltage drop across resistor 110 is much less than when both P-channel MOS devices 50, 60 are on. Since no current flows across resistor 100 there is no voltage drop, thus the input threshold of NAND gate 150 is always present at the node where the control input signal 70 enters the circuit. By design, the input threshold of the inverter 40 and the NAND gate 150 are the same.

When control input signal 70 proceeds low on its first transition, it initially comes to the threshold of the NAND gate 150 which causes latch 20 to reset. Once the latch 20 is reset, P-channel MOS device 60 is turned off which stops the flow of current through resistor 110. When current stops flowing through resistor 110, the voltage drop across resistor 110 goes to 0V, the threshold at the node where the control input signal 70 enters the circuit rises to the threshold of inverter 40. The inverter 40 then switches and the input impedance at the node where control input signal 70 reverts to that of a standard high impedance CMOS input. Although very simple, a key concept in this invention is the ability to shift the input voltage threshold at the input of an integrated circuit by having the input source or sink current across an input resistor.

Two signal paths are shown from the control input signal 70 represented by "control input low" to nodes IN 220 and PAD 230. When either the strong MOS device 50 or the weak MOS device 60 (or both) is on and an external source is pulling the control input low, current will flow across resistor 110, thereby causing a voltage drop across resistor 110 which will result in a low shift in the input voltage threshold of the input "control input low" with respect to the input voltage threshold of inverter 40. When the strong MOS device 50 is on, the low shift in input voltage threshold is enough to prevent node IN 220 from reaching the input voltage threshold of inverter 40 even when control signal 70 is at ground, blocking the enabling of the transmitter. The threshold voltage of inverter 40 matches the input voltage threshold of NAND gate 150. Since no source for current flow exists across resistor 100, a voltage drop never exists across the resistor and therefore no shift in the input voltage threshold will occur.

After the strong MOS device 50 is off and only the weak MOS device 60 remains on, there is still a small voltage drop across resistor 110. Because the threshold voltage of inverter 40 matches the input voltage threshold of NAND gate 150, on the initial falling edge of the control signal 70, NAND gate 150 will be the first to switch. This switching will reset latch 20 and turn off the weak MOS device 60, thereby eliminating the small voltage drop across resistor 110. The inverter 40 will switch, thereby enabling the transmitter. Since there is no voltage drop to the input of NAND gate 150 and since the input voltage threshold of NAND gate 150 matches inverter 40, the initial falling edge of the control signal 70 "control input low" will have the same threshold as all following edges. Prior to time out of the timer, the input threshold voltage will be shifted significantly lower, blocking enabling of the transmitter.

The implementation of this design was completed in a CMOS technology as illustrated in the schematics described herein. Using the concepts described here, the invention could equally well be implemented in a bipolar technology.

III. Circuit-Enabled High

Figure 5A:
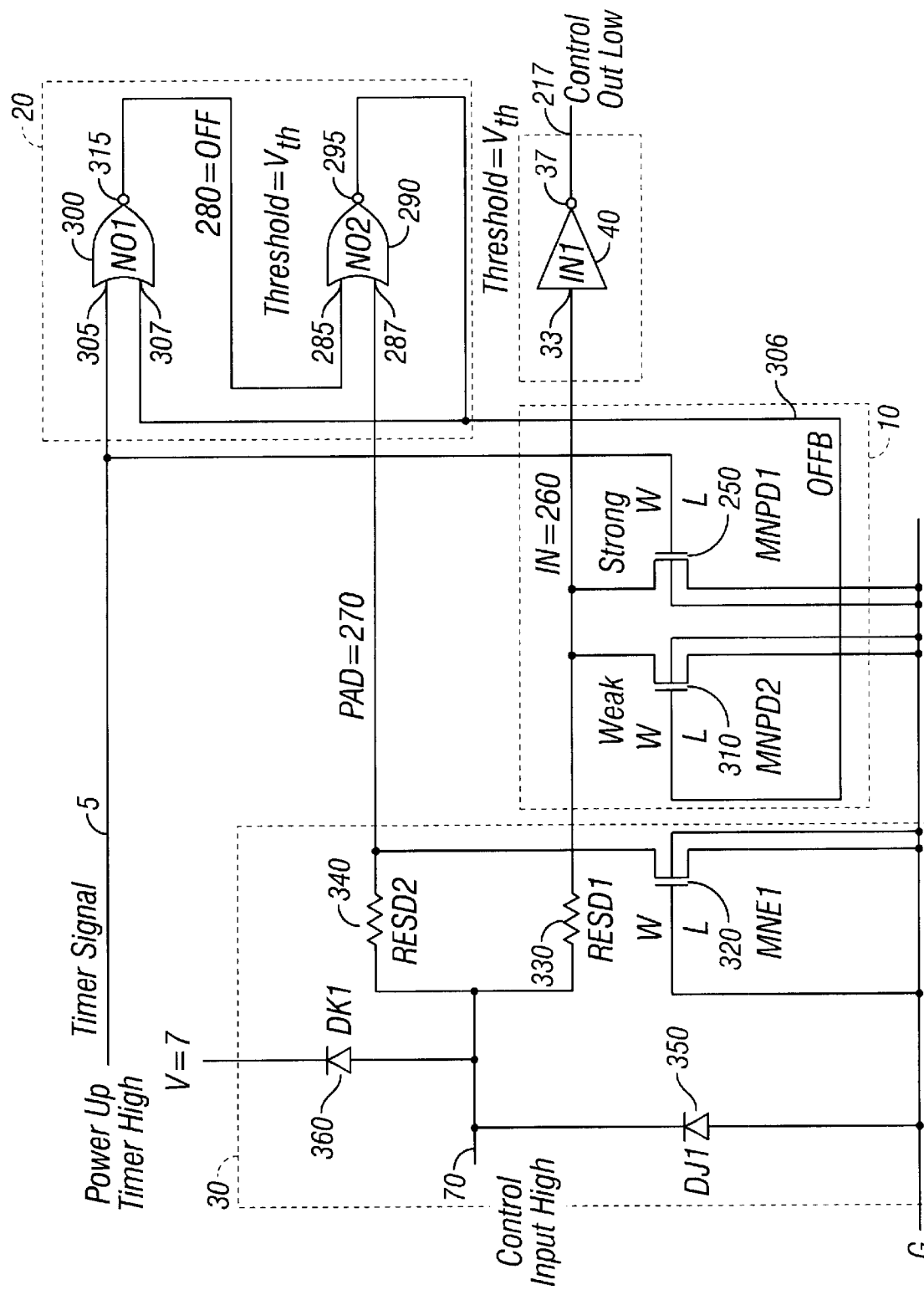
FIG. 5A is an illustration of a semiconductor integrated circuit device where the input is enabled high in accordance with one embodiment of the present invention with ESD protection.

Referring now to FIG. 5A, illustrated is a circuit diagram representation of the integrated circuit for input logic-state control where the control signal 70 is enabled high. The major elements of the circuit can be seen superimposed over the individual elements. The major elements include a switching circuit 10, a latch 20, an electrostatic discharge protection circuit 30 and an inverter 40.

The switching circuit includes two N-channel MOS device, the weak MOS device 310 and the strong MOS device 250. The latch includes two NOR gates 300, 290. The first NOR gate 300 has two input terminals 305, 307 and an output terminal 315. The second NOR gate has two input terminals 285, 287 and an output terminal 295.

The ESD protection circuit 30 shown in this FIG. 5A is similar to the ESD protection of the circuit shown in FIG. 2A where the control signal 70 was enabled low, with a significant difference being that there is only one N-channel MOS device 320 in this circuit, as opposed to the two N-channel MOS devices in the circuit shown in FIG. 2A. This is because the two MOS devices 310, 250 where the input is enabled high provide ESD protection in addition to their switching function, thus simplifying the circuitry in this respect. The ESD protection circuit includes two diodes 350, 360, two resistors 330, 340 and an N-channel MOS device 320.

Figure 5B:
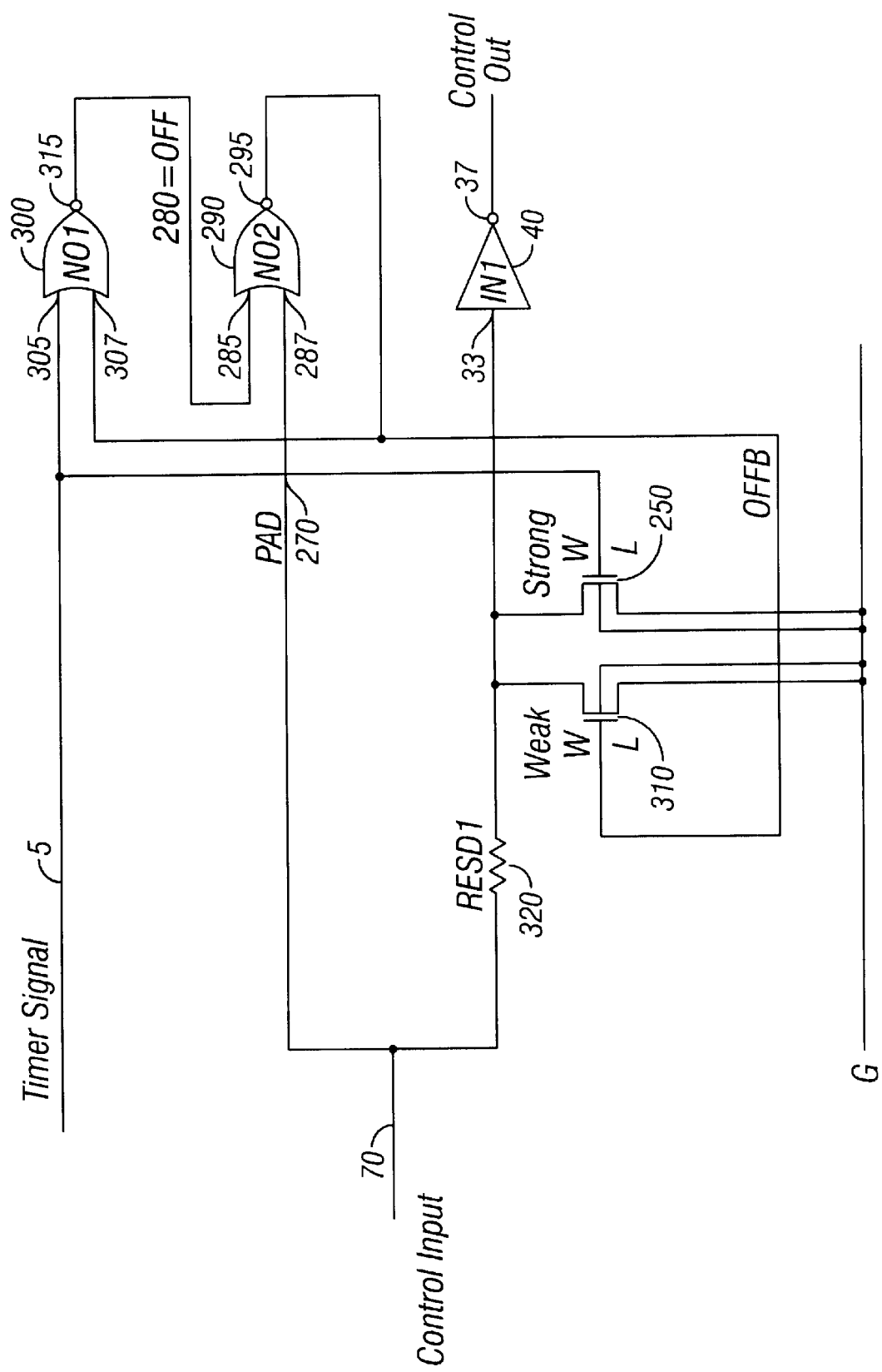
FIG. 5B is an illustration of a semiconductor integrated circuit device where the input is enabled high in accordance with one embodiment of the present invention without ESD protection.
Figure 6:
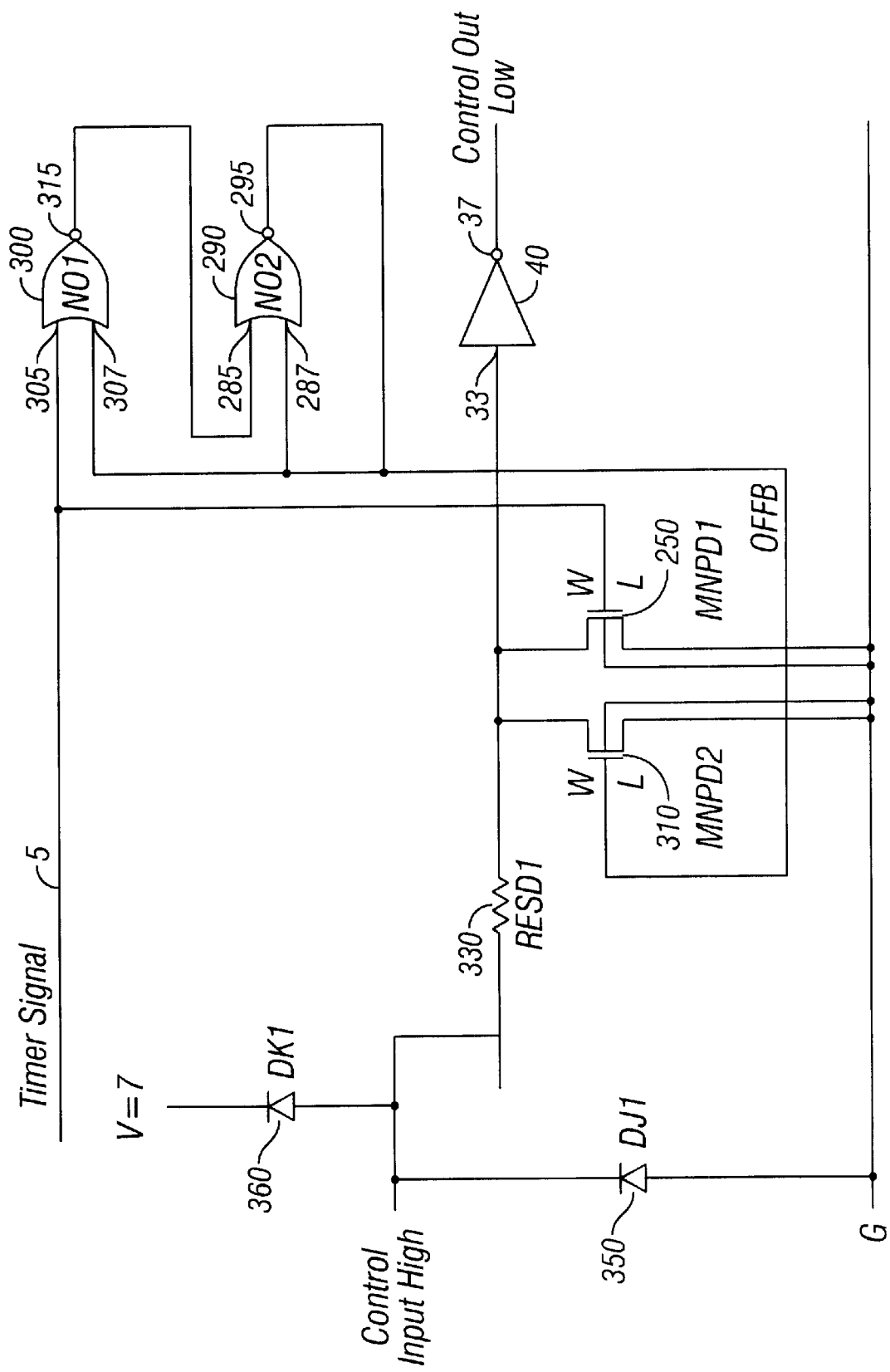
FIG. 6 is an illustration of an alternate embodiment of the semiconductor integrated circuit device where the input is enabled high in accordance with another embodiment of the present invention with ESD protection.

As stated previously, the semiconductor integrated circuit for input logic-state control can take other forms, and each can exist both with and without ESD protection. Referring now to FIG. 5B, illustrated is an embodiment of the circuit of FIG. 5A without ESD protection. Accordingly, the protection diodes 350 and 360 are removed as are the NMOS protection device 320 and the input resistor 340. Referring now to FIG. 6, illustrated is a circuit performing a similar function where the input signal path has been reconfigured and the ESD protection has been retained. Accordingly, the resistor 340 of FIG. 5A has been removed and the input of NOR gate 290 has been tied to the input of inverter 40.

Figure 7:
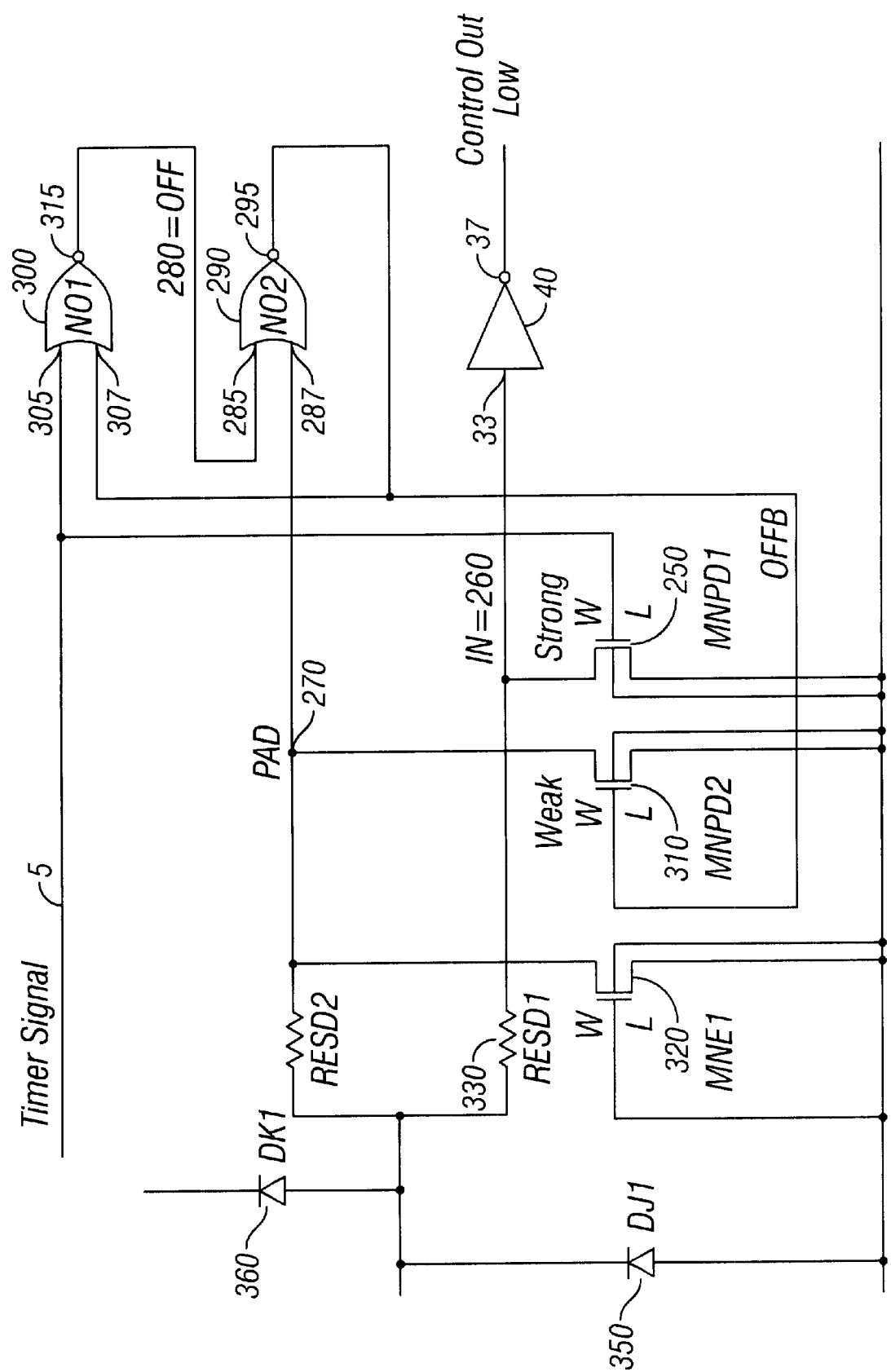
FIG. 7 is an illustration of yet another alternate embodiment of the semiconductor integrated circuit device where the input is enabled high in accordance with another embodiment of the present invention with ESD protection.

Referring now to FIG. 7, illustrated is yet another circuit performing a similar function where the input signal path has been reconfigured and the ESD protection has been retained. Accordingly, the MOS device 310 is connected to the node PAD 270, the input of NOR gate 290. For the purpose of consistency of the input voltage threshold and the quality of the input performance relative to a performance specification, the circuit configuration of FIG. 5A is preferred. ESD protection is present by virtue of the presence of the diodes 350 and 360. ESD protection can be removed with the removal of these devices generally without otherwise effecting the function of the circuit.

Referring back to FIG. 5A, the inverter 40 has an input terminal 33 and an output terminal 37. In this embodiment, the control input signal 70 is active high which means that if the input "control input high" 70 is near the supply voltage, the transmitter will be enabled. As the supply voltage ramps up past a single MOS device threshold, the signal 5 "power up timer high" goes high to the ramping supply voltage. The signal is held high at V. Since the signal 5 is held high, a strong N-channel MOS device 250 is on and pulls the nodes IN 260 to ground and, if there is no external voltage or current source driving control signal 70, PAD 270 goes to ground (0V). Because the input terminal 305 is high, the output of NOR gate 300 at OFF 280 goes to 0V and because both input terminals 285 and 287 are low the output of NOR gate 290 at OFFB 306 goes to the high ramping supply voltage. The weak N-channel MOS device 310 is on. The strong N-channel MOS device 250, by its very nature, is capable of sinking significant current from the input pin of the data communication transceiver which is attached to an output driver of a communication processor. This ability of the strong N-channel MOS device 250 to sink significant current allows it to charge up external parasitic capacitance and pull the control input signal 70—represented by "control input high"—low to 0V to as the supply voltage ramps to the final supply voltage. As the voltage continues to ramp, the node IN 260 is held below the input voltage threshold of inverter 40 and the internal node 217 "control out low" stays high which is the disabled state.

The timer signal 5 "power up timer high" stays high until an internal timer times out. The timer stays on for a period of 10 microseconds to 20 microseconds, and the timer starts after the supply voltage ramps past about half the final power supply voltage. When the timer does eventually time out, the signal "power up timer high" 5 goes low, and the strong NMOS device 250 is turned off and only the weak NMOS device remains on. Also, because the NOR gates 300, 290 form a common set-reset latch, when the timer times out and the signal "power up timer high" input to gate 300 goes low, the output of NOR gate 290 does not change. When the control signal 70 "control input high" is pulled above the input voltage threshold of the NOR gate 290, the output of NOR gate 290 at node OFFB 306 is switched from high to low and the weak MOS device 310 is turned off. In addition, because both inputs to NOR gate 300 are now low the output of NOR gate 300 goes high and the latch 20 has changed state and will retain this state independent of changes in the state of control signal 70. At this point, both the strong MOS device 250 and the weak MOS device 310 are turned off. Therefore, the input impedance at the control input reverts to a standard CMOS input.

Two signal paths exist from the control input signal 70 to nodes IN 260 and PAD 270. When either the strong MOS device 250 or the weak MOS device 310 (or both) is on and an external source is pulling the control signal 70 low, current will flow across resistor 330, thereby causing a voltage drop across resistor 330 which will result in a high shift in the input voltage threshold of the control signal 70 "control input high" with respect to the input voltage threshold of inverter 40. When the strong MOS device 250 is on, the high shift in input voltage threshold is enough to prevent node IN 260 from reaching the input voltage threshold of inverter 40 even when control signal 70 is at the supply voltage V, blocking the enabling of the transmitter. The threshold voltage of inverter 40 matches the input voltage threshold of NOR gate 290. Since no source for current flow exists across resistor 340, a voltage drop never exists across the resistor and therefore no shift in the input voltage threshold will occur.

After the strong MOS device 250 is off and only the weak MOS device 310 remains on, there is still a small voltage drop across resistor 330. Because the threshold voltage of inverter 40 matches the input voltage threshold of NOR gate 290, on the initial falling edge of the control signal 70, NOR gate 290 will be the first to switch. This switching will reset latch 20 and turn off the weak MOS device 310, thereby eliminating the small voltage drop across resistor 330. The inverter 40 will switch, thereby enabling the transmitter. Since there is no voltage drop to the input of NOR gate 290 and since the input voltage threshold of NOR gate 290 matches inverter 40, the initial falling edge of the control signal 70 "control input high" will have the same threshold as all following edges. Prior to time out of the timer, the input voltage threshold will be shifted significantly lower, blocking the enabling of the transmitter.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A semiconductor integrated circuit for input logic-state control during and following power up, the circuit comprising:

a supply voltage device for producing a supply voltage, wherein the supply voltage ramps from zero volts to a final value during power-up;

a switching device;

a timer device for providing a timer input signal into the switching device;

a control input device for providing a control input signal;

a latching device, said latching device providing logic input into the switching device; and an inverter;

wherein the semiconductor integrated circuit device is capable of selectively enabling or disabling a communication device according to the voltage level of the control input signal and the threshold voltage of the communication device such that large transitions are not detected in a data cable to the communication device.

2. The semiconductor integrated circuit device of claim 1 further comprising:

an electrostatic discharge protection device, wherein said supply voltage is input into said electrostatic discharge protection device, wherein the electrostatic discharge protection device is coupled to ground, and wherein the electrostatic discharge protection device is also coupled to the switching device, and wherein the control input signal is provided into the electrostatic discharge protection device.

3. The semiconductor integrated circuit device of claim 2 wherein the electrostatic discharge protection device includes two N-channel MOS devices, two diodes and two resistors.

4. The semiconductor integrated circuit device of claim 2 wherein the electrostatic discharge protection device includes two diodes, two resistors and one N-channel MOS device.

5. The semiconductor integrated circuit device of claim 1 wherein the switching device includes two P-channel MOS devices.

6. The semiconductor integrated circuit device of claim 5 wherein one of the two P-channel MOS devices is a weak MOS device, including a weak MOS gate device, and one of the two P-channel MOS devices is a strong MOS device, including a strong MOS gate device, and wherein the strong MOS gate device is controlled by said timer input signal, and wherein the weak MOS gate device is controlled by the latching device.

7. The semiconductor integrated circuit device of claim 1 wherein the latching device includes a pair of cross-coupled NAND gates.

8. The semiconductor integrated circuit device of claim 7 wherein each NAND gate includes two input terminals and one output terminal.

9. The semiconductor integrated circuit device of claim 1 wherein the switching device includes two N-channel MOS devices.

10. The semiconductor integrated circuit device of claim 1 wherein the latching device includes a pair of cross-coupled NOR gates.

11. A semiconductor integrated circuit for input logic-state control during and following power-up, the circuit being enabled low, the circuit comprising:
a first NAND gate, the first NAND gate having a first input terminal, a second input terminal and an output terminal;
a second NAND gate, the second NAND gate having a first input terminal, a second input terminal and an output terminal, wherein the second NAND gate is operably coupled to the first NAND gate;
a control input node common to the input location of a control input signal;
a first MOS device, wherein the first MOS device is a P-channel weak MOS device, the first MOS device is operably coupled to a second resistor;
a second MOS device, wherein the second MOS device is a P-channel weak MOS device, and the second MOS device is operably coupled to the first MOS device; and
a MOS node, wherein said MOS node is common to the first MOS device and an input terminal of an inverter; and
wherein the semiconductor integrated circuit device selectively enables or disables a communication device according to the voltage level of the control input signal and a threshold voltage of the communication device such that large transitions are not detected in a data cable to the communication device.

12. The semiconductor integrated circuit of claim 11 further comprising:
a first resistor, wherein the first resistor is operably coupled to the first NAND gate;
a first diode, wherein the first diode is operably coupled to the control input signal;
a third MOS device, wherein the third MOS device is operably coupled to the MOS node;
a fourth MOS device, wherein the fourth MOS device is operably coupled to the third MOS device; and
a second diode, wherein the second diode is operably coupled to the fourth MOS device; and
wherein the semiconductor integrated circuit device selectively enables or disables a communication device according to the voltage level of the control input signal and a threshold voltage of the communication device such that large transitions are not detected in a data cable to the communication device.

13. The semiconductor integrated circuit device of claim 12 wherein the first diode, the second diode, the first resistor, the second resistor, the third MOS device and the fourth MOS device are elements of an electrostatic discharge circuit.

14. The semiconductor integrated circuit device of claim 11 wherein the first MOS device and the second MOS device are elements of a switching circuit.

15. The semiconductor integrated circuit device of claim 11 wherein the first NAND gate and the second NAND gate are cross-coupled to form a set-reset latch.

16. A semiconductor integrated circuit for input logic-state control during and following power up, the circuit being enabled high, the circuit comprising:
a first NOR gate;
a second NOR gate, wherein the second NOR gate is operably coupled to the first NOR gate;
a first MOS device, wherein the first MOS device is a weak N-channel MOS device and the first MOS device is operably coupled to the second NOR gate;
a second MOS device, wherein the second MOS device is a strong N-channel MOS device, and the second MOS device is operably coupled to the first MOS device;
a first resistor, wherein the first resistor is operably coupled to the second MOS device;
a first node common to the second MOS device and an inverter; and
a second node common to a control input signal; and
wherein the semiconductor integrated circuit device selectively enables or disables a communication device according to the voltage level of the control input signal and a threshold voltage of the communication device such that large transitions are not detected in a data cable to the communication device.

17. The semiconductor integrated circuit of claim 16 further comprising:
a second resistor, wherein the second resistor is operably coupled to the first resistor;
a third MOS device, wherein the third MOS device is operably coupled to the second resistor;
a first diode, wherein the first diode is operably coupled to third MOS device and the control input signal; and
a second diode, wherein the second diode is operably coupled to the first diode and to a supply voltage.

18. The semiconductor integrated circuit device of claim 17 wherein the first resistor, the second resistor, the third MOS device the first diode and the second diode are elements of an electrostatic discharge protection circuit.

19. The semiconductor integrated circuit of claim 16 wherein the first NOR gate and the second NOR gate are cross-coupled, and said first NOR gate and the second NOR gate are elements of a set-reset latch.

20. The semiconductor integrated circuit of claim 16 wherein the first MOS device and the second MOS device are elements of a switching circuit.

21. A communication device with an enabling/disabling circuit, said communication device being enabled or disabled according to the enabling/disabling circuit, the device comprising:
a communication processor device, the communication processor having an output driver;
a data communication transceiver device, the data communication transceiver device having a transmitter, a receiver, an input pin, a logic interface, and data interface, the data interface being connected to a data cable and the input pin being operably coupled to the output driver of the communication processor device;
the enabling/disabling circuit, the circuit being operably connected to the input pin of the data communication transceiver, wherein the enabling/disabling circuit enables the transmitter when a control input voltage reaches a final supply voltage of the transceiver, and the enabling/disabling circuit comprises:
a switching circuit;
an electrostatic discharge protection circuit;
a latching device; and
an inverter;
wherein a control input signal is input into the electrostatic discharge protection circuit, the electrostatic discharge protection circuit operably coupled to the switching circuit and the latching device, the switching circuit is operably coupled to the latching device.

22. The communication device of claim 21 wherein the switching circuit includes two P-channel MOS devices.

23. The communication device of claim 22 wherein one of the MOS devices is a weak MOS device and one of the MOS devices is a strong MOS device.

24. The communication device of claim 21 wherein the latching device includes a pair of cross-coupled NAND gates.

25. The communication device of claim 24 wherein each NAND gate includes two input terminals and one output terminal.

26. The communication device of claim 21 wherein the electrostatic discharge protection circuit includes two MOS devices, two diodes and two resistors.

27. The communication device of claim 21 wherein the switching circuit includes two N-channel MOS devices.

28. The communication device of claim 21 wherein the latching device includes a pair of cross-coupled NOR gates.

29. The communication device of claim 21 wherein the electrostatic discharge protection circuit includes two diodes, two resistors and one MOS device.

30. A communication device with an enabling/disabling circuit for input logic-state control, wherein the circuit being enabled low, the communication device comprising:
a communication processor device, the communication processor having an output driver;
a data communication transceiver device, the data communication transceiver device having a transmitter, a receiver, an input pin, a logic interface, and a data interface, the data interface being connected to a data cable and the input pin being operably coupled to the output driver of the communication processor device;
the enabling/disabling circuit, the circuit being operably connected to the input pin of the data communication transceiver, wherein the enabling/disabling circuit enables the transmitter when a control input voltage reaches a final supply voltage of the transceiver, the enabling/disabling circuit comprising:
a first NAND gate, the first NAND gate having a first input terminal, a second input terminal and an output terminal;
a second NAND gate, the second NAND gate having a first input terminal, a second input terminal and an output terminal, wherein the second NAND gate is operably coupled to the first NAND gate;
a first resistor, wherein the first resistor is operably coupled to the second NAND gate;
a control input node common to the input location of a control input signal;
a first diode, wherein the first diode is operably coupled to the control input signal;
a first MOS device, wherein the first MOS device is a P-channel weak MOS device, the first MOS device is operably coupled to the first diode;
a second MOS device, wherein the second MOS device is a P-channel weak MOS device, and the second MOS device is operably coupled to the first MOS device;
a MOS node, wherein said MOS node is common to the first MOS device and an input terminal of an inverter;
a third MOS device, wherein the third MOS device is operably to the MOS node;
a fourth MOS device, wherein the fourth MOS device is operably coupled to the third MOS device;
a second diode, wherein the second diode is operably coupled to a fourth MOS device; and
a second resistor, wherein the second resistor is operably coupled to the fourth MOS device.

31. The communication device of claim 30 wherein the first MOS device and the second MOS device are elements of a switching circuit.

32. The communication device of claim 30 wherein the first NAND gate and the second NAND gate are cross-coupled to form a set-reset latch.

33. The communication device of claim 30 wherein the first diode, the second diode, the first resistor, the second resistor, the third MOS device and the fourth MOS device are elements of an electrostatic discharge circuit.

34. A communication device with an enabling/disabling circuit for input logic-state control during and following power up, the circuit being enabled high, the communication device comprising:
a communication processor device, the communication processor having an output driver;
a data communication transceiver device, the data communication transceiver device having a transmitter, a receiver and an input pin, the input pin being operably coupled to the output driver of the communication processor device;
the enabling/disabling circuit, the circuit being operably connected to the input in of the data communication transceiver, wherein the enabling/disabling circuit enables a transmitter when a control input voltage reaches a final supply voltage of the transceiver, wherein the enabling/disabling circuit comprises:
a first NOR gate;
a second NOR gate, wherein the second NOR gate is operably coupled to the first NOR gate;
a first MOS device, wherein the first MOS device is a weak N-channel MOS device and the first MOS device is operably coupled to the second NOR gate;

a second MOS device, wherein the second MOS device is a strong N-channel MOS device, and the second MOS device is operably coupled to the first MOS device;

a first resistor, wherein the first resistor is operably coupled to the second MOS device;

a second resistor, wherein the second resistor is operably coupled to the first resistor;

a third MOS device, wherein the third MOS device is operably coupled to the second resistor;

a first diode, wherein the first diode is operably coupled to the third MOS device;

a second diode, wherein the second diode is operably coupled to the first diode and to a supply voltage;

a first node common to the second MOS device and an inverter; and a second node common to a control input signal and the first diode.

35. The semiconductor integrated circuit of claim 34 wherein the first NOR gate and the second NOR gate are cross-coupled, and said first NOR gate and the second NOR gate are elements of a set-reset latch.

36. The semiconductor integrated circuit of 34 wherein the first MOS device and the second MOS device are elements of a switching circuit.

37. The communication of claim 34 wherein the first resistor, the second resistor, the third MOS device the first diode and the second diode are elements of an electrostatic discharge protection circuit.

* * * * *